(12) United States Patent
Bickford et al.

(10) Patent No.: US 9,653,330 B1
(45) Date of Patent: May 16, 2017

(54) THRESHOLD VOLTAGE (VT)-TYPE TRANSISTOR SENSITIVE AND/OR FAN-OUT SENSITIVE SELECTIVE VOLTAGE BINNING

(71) Applicant: GLOBALFOUNDRIES INC., Grand Cayman (KY)

(72) Inventors: Jeanne P. Bickford, Essex Junction, VT (US); John R. Goss, Saint Albans, VT (US); Robert J. McMahon, Essex Junction, VT (US); Troy J. Perry, Georgia, VT (US); Thomas G. Sopchak, Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/015,535

(22) Filed: Feb. 4, 2016

(51) Int. Cl.
| | | |
|---|---|---|
| *H01L 21/00* | (2006.01) | |
| *H01L 21/67* | (2006.01) | |
| *H01L 21/66* | (2006.01) | |
| *G06F 17/50* | (2006.01) | |
| *G01R 31/317* | (2006.01) | |

(52) U.S. Cl.
CPC .. *H01L 21/67271* (2013.01); *G01R 31/31718* (2013.01); *G06F 17/5045* (2013.01); *H01L 22/14* (2013.01)

(58) Field of Classification Search
None
See application file for complete search history.

(56) References Cited

U.S. PATENT DOCUMENTS

| | | | |
|---|---|---|---|
| 3,265,971 A * | 8/1966 | Montone | G01R 31/2632 318/660 |
| 7,475,366 B2 | 1/2009 | Kuemerle et al. | |
| 7,718,448 B1 * | 5/2010 | Brisbin | H01L 22/34 257/204 |

(Continued)

OTHER PUBLICATIONS

Susan Lichtensteiger et al., "Using Selective Voltage Binning to Maximize Yield", IEEE, ASMC 2012, Apr. 2012, pp. 7-12.

(Continued)

*Primary Examiner* — Angel Roman
(74) *Attorney, Agent, or Firm* — Gibb & Riley, LLC; David A. Cain, Esq.

(57) ABSTRACT

Disclosed are methods for performing threshold voltage (VT)-type transistor sensitive and/or fan-out sensitive selective voltage binning (SVB) to improve SVB accuracy and, thereby product yield and reliability. In the methods, a process distribution for an integrated circuit chip design is divided into process windows, each associated with a corresponding performance range and a corresponding minimum supply voltage. First performance measurements are acquired from first performance monitors associated with first transistors on chips manufactured according to the design. Based on the first performance measurements, the chips are assigned to groups corresponding to the process windows. Second performance measurements are also be acquired from second performance monitors associated with second transistors, which are on the chips and which have either a different VT-type or a different maximum fan-out than the first transistors. Based on the second performance measurements, a determination is made as to whether chip group reassignment is warranted.

20 Claims, 7 Drawing Sheets

(56) References Cited

U.S. PATENT DOCUMENTS

| | | |
|---|---|---|
| 7,810,054 B2 | 10/2010 | Anemikos et al. |
| 8,781,792 B2 | 7/2014 | Visweswariah et al. |
| 2011/0106497 A1 | 5/2011 | Visweswariah et al. |
| 2013/0113514 A1 | 5/2013 | Anemikos et al. |
| 2014/0028348 A1* | 1/2014 | Andreev ............ H03K 19/0948 326/41 |
| 2014/0100799 A1 | 4/2014 | Bickford et al. |
| 2014/0107822 A1 | 4/2014 | Chadwick et al. |

OTHER PUBLICATIONS

Ruijing Shen et al., "A New Voltage Binning Technique for Yield Improvement Based on Graph Theory" IEEE 13th Int'l Symposium on Quality Electronic Design, 2012, pp. 243-249.

Vladimir Zolotov et al., "Voltage Binning Under Process Variation", ICCAD 2009, pp. 1-8.

\* cited by examiner

CHIP-GROUP ASSIGNMENT

PERFORMANCE BASED CHIP-GROUP REASSIGNMENT

PERFORMANCE AND LEAKAGE POWER BASED CHIP-GROUP REASSIGNMENT

Fast      Process Distribution      Slow

|  | 501A | 501B | 501C | 501D | 501E | 501F | 501G | 501H |
|---|---|---|---|---|---|---|---|---|
| Chip #1 |  | X |  |  |  |  |  |  |
| Chip #2 |  |  | X | →Y |  |  |  |  |
| ... |  |  |  |  |  |  |  |  |
| Chip $N$ |  |  |  |  |  | X |  |  |

FIG. 8

THRESHOLD VOLTAGE (VT)-TYPE TRANSISTOR SENSITIVE AND/OR FAN-OUT SENSITIVE SELECTIVE VOLTAGE BINNING

FIELD OF THE INVENTION

The present disclosure relates to selective voltage binning (SVB) of integrated circuit (IC) chips and, more specifically, to a method for improving SVB accuracy and, thereby IC chip yield and product reliability.

BACKGROUND

Selective voltage binning (SVB) is a technique that was developed in order to reduce power consumption at the "fast" end of the process distribution, while increasing operating speed at the "slow" end of the process distribution. Typically, in SVB, a full process distribution for an IC chip design at a target voltage and a target temperature for the technology at issue and with respect to a target threshold voltage (VT)-type transistor is defined prior to manufacturing (e.g., based on a best case/worst case analysis) or after manufacturing (e.g., based on actual performance measurements taken from performance monitors, such as performance screen ring oscillators (PSROs), associated with the target VT-type transistor on IC chips that are manufactured according to the IC design). It should be understood that a given IC chip design will often incorporate multiple different VT-type transistors (e.g., regular threshold voltage (RVT) transistors, high threshold voltage (HVT) transistors, mezzanine threshold voltage (MVT) transistors, super-high threshold voltage (SHVT) transistors, low threshold voltage (LVT) transistors, ultra-high threshold voltage (UHVT) transistors, etc.) and the target VT-type will be one of these different VT-types (e.g., MVT). Additionally, it should be understood that the performance monitors described above can be on-chip performance monitors and/or in-Kerf performance monitors (i.e., performance monitors located in the Kerf-lines between IC chips manufactured on a semiconductor wafer).

In any case, once defined, the full process distribution is then divided into successive intervals (also referred to as process windows) and different voltage ranges are assigned to each successive interval (i.e., to each process window) such that relatively low supply voltage ranges (minimum supply voltage to maximum supply voltage) within the allowable voltage range for the technology are assigned to intervals at the "fast" end of the process distribution and relatively high voltage ranges are assigned to intervals at the "slow" end of the process distribution. Subsequently, performance measurements are taken from on-chip and/or in-Kerf performance monitors of manufactured IC chips, as discussed above and, based on these performance measurements, the IC chips are sorted into different groups (also referred to as voltage bins) that correspond to different process windows. This process of assigning the IC chips to the different groups that correspond to different process windows based on their specific performance measurements is referred to as selective voltage binning. When such IC chips are shipped for incorporation into products, the voltage ranges associated with their respective voltage bins are noted. Operation of relatively fast IC chips at lower voltage ranges minimizes worst-case power consumption and operation of relatively slow IC chips at higher voltage ranges improves their performance (e.g., increases their operating speed/reduces their delay). Recently, it has been noted that some IC chips with performance measurements that warrant them being placed in a group associated with a process window at the "fast" end of the process distribution actually fail to meet performance requirements when operated at the low minimum supply voltage assigned to that process window.

SUMMARY

In view of the foregoing, disclosed herein are methods for performing threshold voltage (VT)-type transistor sensitive and/or fan-out sensitive selective voltage binning (SVB) to improve SVB accuracy. In the methods, a process distribution for an integrated circuit (IC) chip design can be divided into process windows, wherein each process window is associated with a corresponding performance range and a corresponding minimum supply voltage. First performance measurements can be acquired from first performance monitors associated with first transistors on IC chips manufactured according to the design. Based on the first performance measurements, the IC chips can be assigned to groups corresponding to the process windows. Second performance measurements can also be acquired from second performance monitors associated with second transistors, which are on the IC chips and which have either a different VT-type or a different maximum fan-out than the first transistors. Based on the second performance measurements, a determination can be made as to whether chip group reassignment is warranted. For example, for a specific IC chip assigned to a specific group corresponding to a specific process window that is associated with a specific performance range, chip group reassignment would be warranted when the second performance measurement is slower than the slowest performance measurement allowed by the specific performance range. By improving the accuracy of SVB in this manner, the methods can be used to improve IC chip yield and ultimately product reliability.

More particularly, disclosed herein is a method for performing threshold voltage (VT)-type transistor sensitive selective voltage binning (SVB) to improve SVB accuracy. In the method, a process distribution for an integrated circuit (IC) chip design can be divided into process windows and each process window can be associated with a corresponding performance range and a corresponding minimum supply voltage. IC chips can be manufactured according to the design. Each of the IC chips can have at least first transistors with a first VT-type and second transistors with a second VT-type. Testing of the IC chips can be performed using a specific supply and a specific operating temperature to acquire first performance measurements from first performance monitors associated with the first transistors and second performance measurements from second performance monitors associated with the second transistors. Based on the first performance measurements, the IC chips can be assigned to groups corresponding to the process windows. Then, based on the second performance measurements, a determination can be made as to whether or not chip group reassignment is warranted. That is, a specific IC chip assigned to a first group, which corresponds to a first process window associated with a first performance range and a first minimum supply voltage, can be selected. Then, a determination can be made as to whether a second performance measurement, which is acquired from a second performance monitor associated with a second transistor on the specific IC chip, is slower than a slowest performance measurement indicated by the first performance range. When the second performance measurement is slower than the slowest performance measurement indicated by the first performance range, the specific IC chip can be reassigned to a second group, which corresponds to a second process window associated with a second performance range and a second minimum supply voltage that is higher than the first minimum supply voltage.

Also disclosed herein is a method for performing fan-out sensitive selective voltage binning (SVB) to improve SVB accuracy. In the method, a process distribution for an integrated circuit (IC) chip design can be divided into process windows and each process window can be associated with a corresponding performance range and a corresponding minimum supply voltage. IC chips can be manufactured according to the design. Each of the IC chips can have at least first transistors with a specific VT-type and a first maximum fan-out and second transistors with the specific VT-type and a second maximum fan-out. Testing of the IC chips can be performed using a specific supply and a specific operating temperature to acquire first performance measurements from first performance monitors associated with the first transistors and second performance measurements from second performance monitors associated with the second transistors. Based on the first performance measurements, the IC chips can be assigned to groups corresponding to the process windows. Then, based on the second performance measurements, a determination can be made as to whether or not chip group reassignment is warranted. That is, a specific IC chip assigned to a first group, which corresponds to a first process window associated with a first performance range and a first minimum supply voltage, can be selected. Then, a determination can be made as to whether a second performance measurement, which is acquired from a second performance monitor associated with a second transistor on the specific IC chip, is slower than a slowest performance measurement indicated by the first performance range. When the second performance measurement is slower than the slowest performance measurement indicated by the first performance range, the specific IC chip can be reassigned to a second group, which corresponds to a second process window associated with a second performance range and a second minimum supply voltage that is higher than the first minimum supply voltage.

Also disclosed herein is a method for performing threshold voltage (VT)-type transistor sensitive and fan-out sensitive selective voltage binning (SVB) to improve SVB accuracy. In the method, a process distribution for an integrated circuit (IC) chip design can be divided into process windows and each process window can be associated with a corresponding performance range and a corresponding minimum supply voltage. IC chips can be manufactured according to the design. Each of the IC chips can have at least first transistors with a first VT-type and a first maximum fan-out, second transistors with the first VT-type and a second maximum fan-out, third transistors with a second VT-type and a third maximum fan-out, and fourth transistors with the second VT-type and a fourth maximum fan-out. Testing of the IC chips can be performed using a specific supply and a specific operating temperature to acquire first performance measurements from first performance monitors associated with the first transistors, second performance measurements from second performance monitors associated with the second transistors, third performance measurements from third performance monitors associated with the third transistors and fourth performance measurements from fourth performance monitors associated with the fourth transistors. Based on the first performance measurements, the IC chips can be assigned to groups corresponding to the process windows. Then, based on the second performance measurements, third performance measurements and the fourth performance measurements, a determination can be made as to whether or not chip group reassignment is warranted. That is, a specific IC chip assigned to a first group, which corresponds to a first process window associated with a first performance range and a first minimum supply voltage, can be selected. Then, a determination can be made as to whether a second performance measurement (which is acquired from a second performance monitor associated with a second transistor on the specific IC chip), a third performance measurement (which is acquired from a third performance monitor associated with a third transistor on the IC chip), and/or a fourth performance measurement (which is acquired from a fourth performance monitor associated with a fourth transistor on the IC chip) is slower than a slowest performance measurement indicated by the first performance range. When the second, third and/or the fourth performance measurement is/are slower than the slowest performance measurement indicated by the first performance range, the specific IC chip can be reassigned to a second group, which corresponds to a second process window associated with a second performance range and a second minimum supply voltage that is higher than the first minimum supply voltage.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 8 is a table illustrating exemplary chip group reassignment based on second performance measurements acquired from second performance monitors and further based on leakage power measurements.

DETAILED DESCRIPTION

Figure 1:
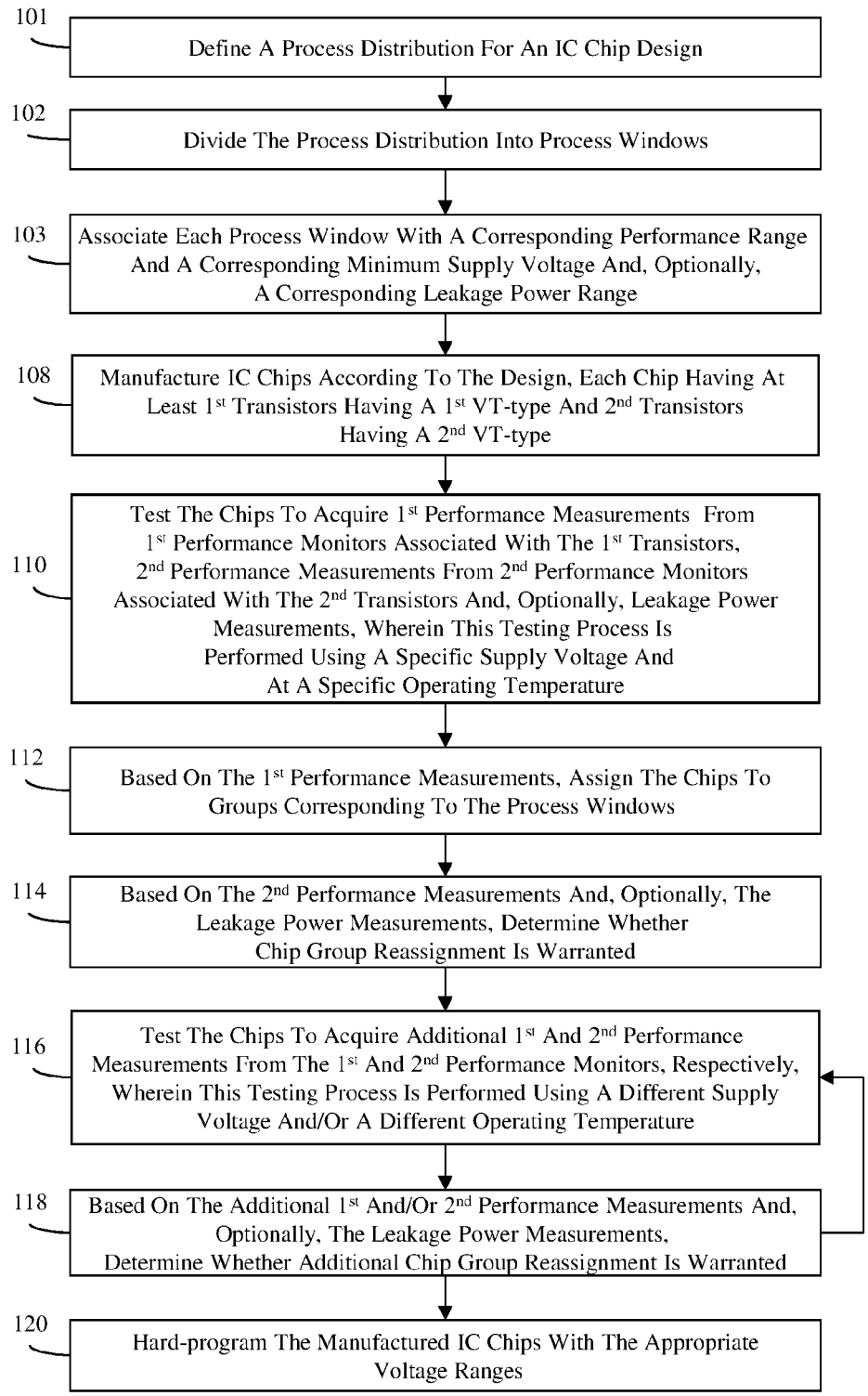
FIG. 1 is a flow diagram illustrating a method for performing threshold voltage (VT)-type transistor sensitive selective voltage binning (SVB)

As mentioned above, it has been noted that some IC chips with performance measurements that warrant them being placed in a group associated with a process window at the "fast" end of the process distribution actually fail to meet performance requirements when operated at the low minimum supply voltage assigned to that process window. In identifying the reason for the failure, it was determined that a previous assumption made with regard to assigning IC chips to the different groups was not correct.

Specifically, the assumption was that the performance of all of the different VT-type transistors on an IC chip, regardless of the corresponding maximum fan-out of those transistors, would be aligned for purposes of assigning that IC chip to a specific group that corresponds to a specific process window. In other words, the assumption was that, for a specific IC chip, if a performance measurement taken from a performance monitor associated with a target VT-type transistor having a target maximum fan-out warranted assigning that specific IC chip into a specific group, then performance measurements taken from performance monitors associated with other VT-type transistors or with the same VT-type transistor having a different maximum fan-out would similarly warrant assigning the specific IC chip into the specific group. Thus, assignment of IC chips into the different groups corresponding to the different process windows was performed based on performance measurements taken from performance monitors associated with the target VT-type transistor having the target maximum fan-out only. However, the inventors have discovered that performance measurements taken from performance monitors associated with different VT-type transistors or the same VT-type transistors with different maximum fan-outs may provide conflicting results. That is, for a specific IC chip, a performance measurement taken from a performance monitor associated with the target VT-type transistor having a target maximum fan-out may warrant assigning the specific IC chip to a first group that corresponds to a first process window, whereas performance monitors associated with different VT-type transistors or the same VT-type transistor having a different maximum fan-out may warrant assigning the specific IC chip to a second group associated with a second process window and, particularly, a process window with a higher minimum supply voltage.

In view of the foregoing, disclosed herein are methods for performing threshold voltage (VT)-type transistor sensitive and/or fan-out sensitive selective voltage binning (SVB) to improve SVB accuracy. In the methods, a process distribution for an integrated circuit (IC) chip design can be divided into process windows, where each process window is associated with a corresponding performance range and a corresponding minimum supply voltage. First performance measurements can be acquired from first performance monitors associated with first transistors on IC chips manufactured according to the design. Based on the first performance measurements, the IC chips can be assigned to groups corresponding to the process windows. Second performance measurements can also be acquired from second performance monitors associated with second transistors, which are on the IC chips and which have either a different VT-type or a different maximum fan-out than the first transistors. Based on the second performance measurements, a determination can be made as to whether or not chip group reassignment is warranted. For example, for a specific IC chip assigned to a specific group corresponding to a specific process window that is associated with a specific performance range, chip group reassignment would be warranted when the second performance measurement is slower than the slowest performance measurement allowed by the specific performance range. By improving the accuracy of SVB in this manner, the methods can be used to improve IC chip yield and ultimately product reliability.

Figure 2:
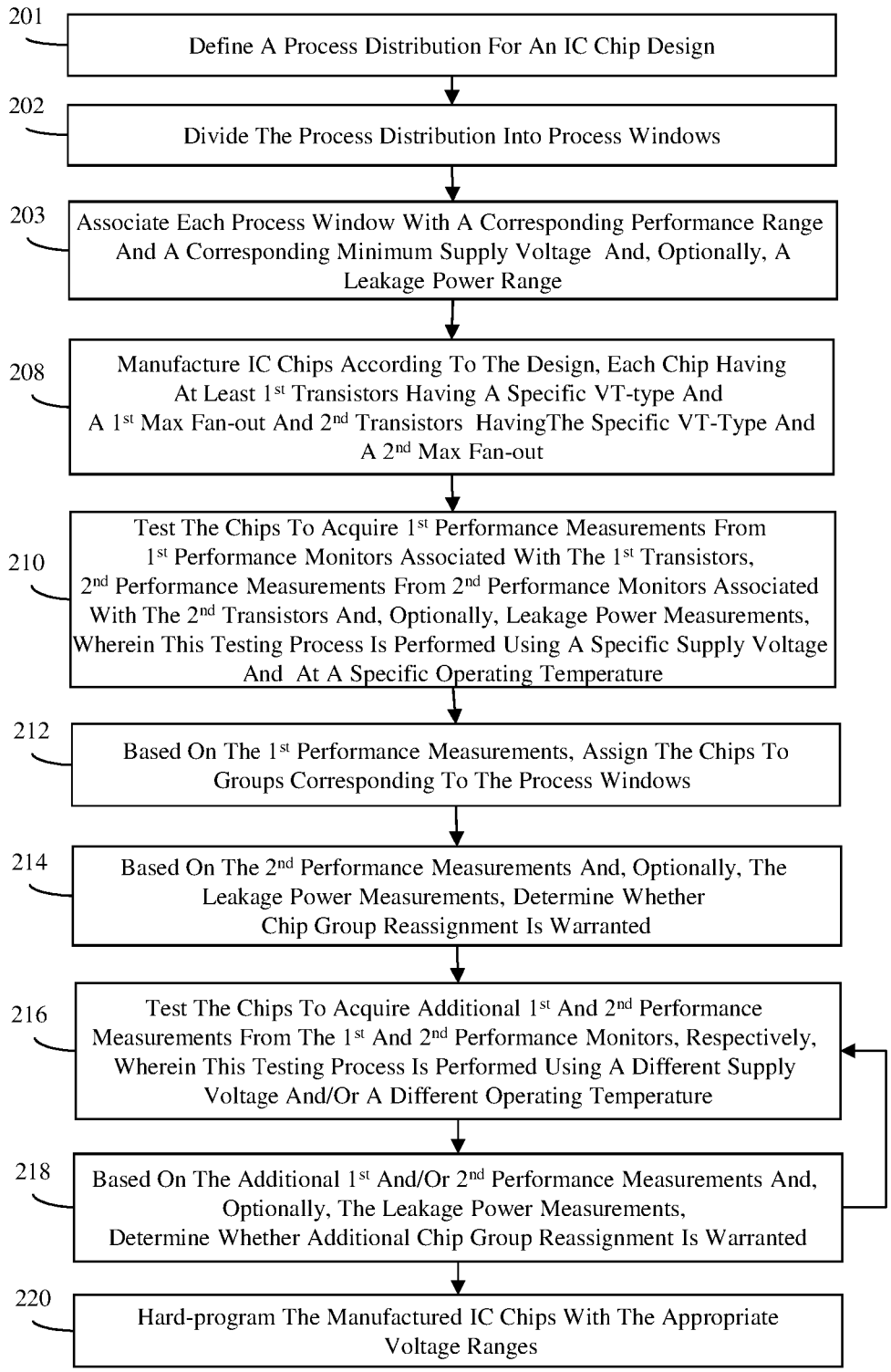
FIG. 2 is a flow diagram illustrating a method for performing fan-out sensitive selective voltage binning (SVB)
Figure 3:
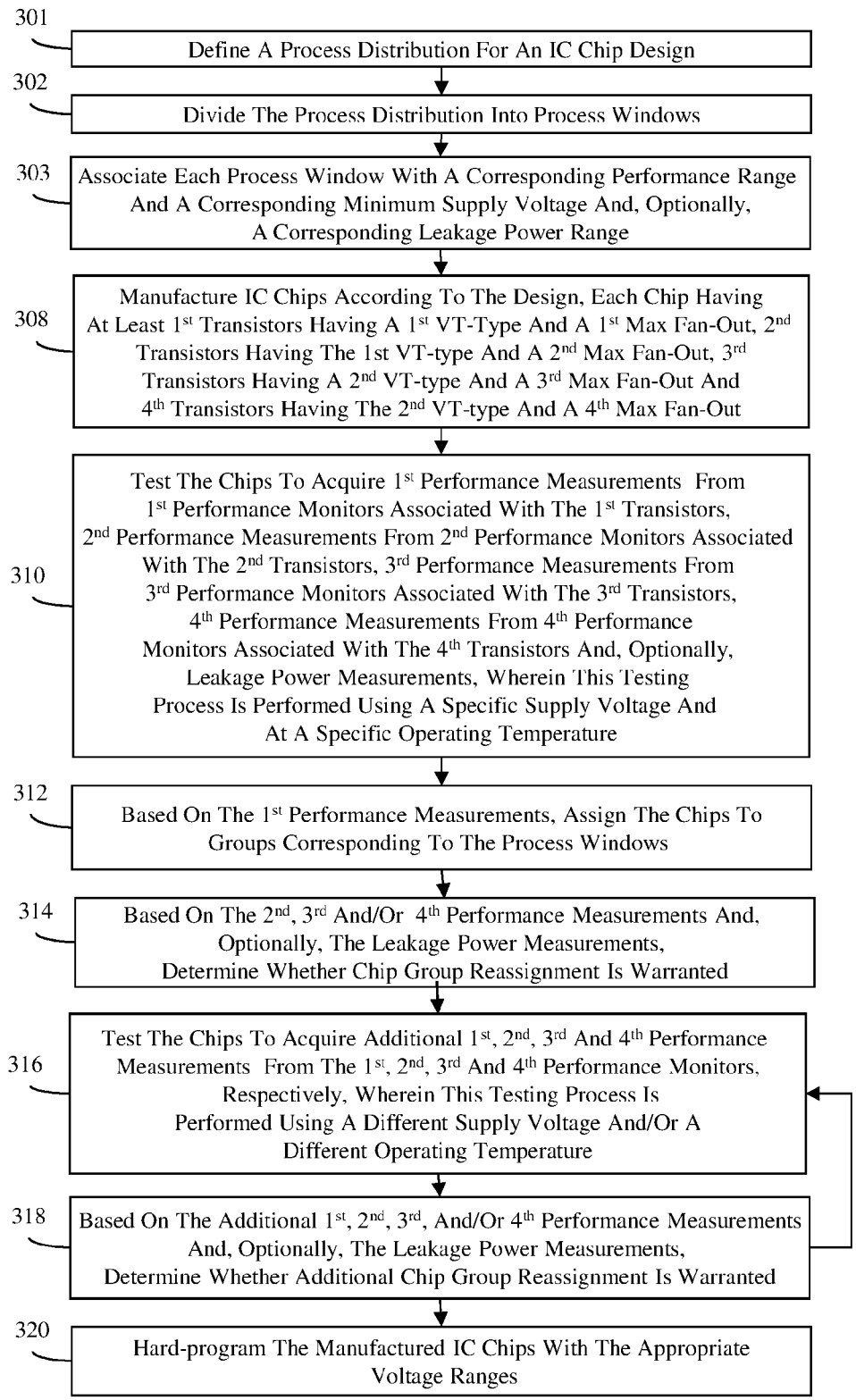
FIG. 3 is a flow diagram for performing threshold voltage (VT)-type transistor sensitive and fan-out sensitive selective voltage binning (SVB)

More particularly, FIG. 1 is a flow diagram illustrating a method for performing threshold voltage (VT)-type transistor sensitive selective voltage binning (SVB), FIG. 2 is a flow diagram illustrating a method for performing fan-out sensitive selective voltage binning (SVB) and FIG. 3 is a flow diagram for performing threshold voltage (VT)-type transistor sensitive and fan-out sensitive selective voltage binning (SVB).

Referring to FIGS. 1-3, each of the methods disclosed herein involve the development of an initial integrated circuit (IC) chip design. The initial IC chip design can be represented by a high-level description, which sets out the requirements for the IC chip. This high-level description can be stored in memory (e.g., on a data storage device) in, for example, a hardware description language (HDL), such as VHDL or Verilog. Those skilled in the art will recognize that this high-level description will set out specifications for various parameters (e.g., for channel length, channel width, doping, spacer width, etc.). Following development of the initial IC chip design, various different physical design processes can be performed in order to generate a design layout. The physical design processes can include, but are not limited to, logic synthesis, placement, and routing. During logic synthesis, the high-level description can be synthesized into low-level constructs (e.g., a gate-level netlist) using library elements (e.g., standard cells in standard cell ASIC design or gate array base cells in gate array ASIC design) or customized elements. During placement, the specific locations for placement on the IC chip of the various library and/or customized elements can be established. During routing, the wires that will interconnect the various library and/or customized elements can be defined. Various different techniques for performing these physical design processes are well known in the art. Thus, the details of such techniques are omitted from this specification in order to allow the reader to focus on the salient aspects of the disclosed methods.

After the design layout is completed, a full process distribution for the IC chip design can be defined based on that design layout (101, 201 or 301).

One technique for defining the full process distribution for the IC chip design can be performed prior to actually manufacturing any IC chips according to IC chip design. In this case, a best case/worst case (or 'fast/slow') analysis of the specific IC chip design can be performed given the design layout. Such a best case/worst case analysis can be performed, for example, by performing a Statistical Static Timing Analysis (SSTA). In a SSTA a single timing run may be performed in a parameterized fashion over a multi-dimensional process space to model process and environmental variations. Specifically, IC gate responses to varying conditions can be captured in the timing models during library characterization using detailed Simulation Program with Integrated Circuit Emphasis (SPICE) simulation models, which accurately predict IC device physics over a range of process and environmental conditions. In addition to modeling process and environmental variations, which are typically assumed to be constant across any single IC chip (often referred to as 'chip-to-chip variation'), a SSTA can also consider Systematic and Random Across Chip Variation (ACV), which accounts for both the systematic variation between devices that increases with spatial separation, as well as the uncorrelated random variation that can exist between even neighboring devices as a result of, for example, line width variation, random dopant fluctuation, etc. The chip-to-chip process and environmental variations are assumed to be constant for a given chip (e.g., if gate A is operating at fast process, all other gates on the same chip are also operating at fast process) and the purpose of modeling chip-to-chip variation is primarily to ensure that as chips are manufactured and operate over a varying set of process and environmental conditions, sufficient functioning chips are manufactured to result in an acceptable yield. In contrast, the modeling of ACV variation is more concerned with ensuring that all chips at any given process point are functional in the presence of ACV. This is often achieved using a concept of "Early" and "Late" timing. To ensure functional hardware, the clock and data signals must be synchronized such that the data does not arrive at a latching element too early relative to the clock and be latched into the incorrect clock cycle (a 'hold fail'). Similarly, the data signal also should not arrive too late and miss the intended latching clock signal (a "setup fail"). This is ensured by assuming the ACV variation results in the earliest possible arrival time for data signals and the latest possible arrival time for clock signals for hold tests, and vice versa for setup tests. The ACV data itself may be modeled, in order of increasing accuracy, using scalars (e.g. early/late are modeled as −/+5% of nominal, to provide a trivial example), as linear combinations of existing characterized data, or via direct characterization of ACV from SPICE. It should also be noted that the ACV conditions themselves can vary as a function of chip-to-chip process and environmental variations (e.g. the split between an Early and Late delay for a given IC design can vary significantly between fast and slow chips). In summary, the SSTA timing models accurately predict chip-to-chip best case/worst case process and environmental variation, as well as 'Early/Late' across chip variation, typically obtained from SPICE based transient simulation.

Figure 4:
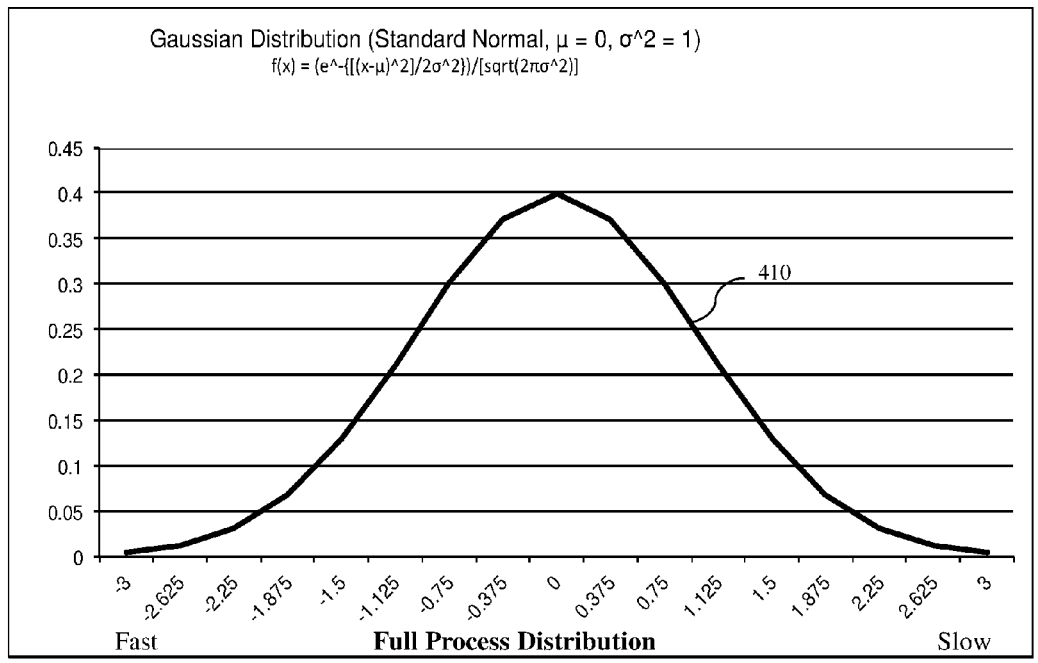
FIG. 4 is a graph illustrating an exemplary full process distribution for an IC chip design.

Based on the results of the best case/worst case analysis, a full process distribution for the IC chip design can be generated and stored in the memory. FIG. 4 is a graph illustrating an exemplary full process distribution 410 for an IC chip design. This full process distribution 410 represents the predicted performance range for IC chips that would be manufactured according to the design layout and operated using a specific supply voltage and at a specific operating temperature. The specific supply voltage and the specific operating temperature can be the target supply voltage and the target operating temperature for the technology node (e.g., a 45 nm, 32 nm, 22 nm, 14 nm, 45 nm SOI, 32 nm SOI, 22 nm SOI, etc.) within which the IC chip is being designed. The predicted performance range can extend from IC chips with relatively fast operating speeds (e.g., −3σ fast IC chips) at one end of the full process distribution (i.e., the "fast" end of the process distribution) to IC chips with relatively slow operating speeds (e.g., 3σ slow IC chips) at the opposite end of the full process distribution (i.e., the "slow" end of the process distribution).

Another technique for defining the full process distribution for the IC chip design can be performed following manufacturing IC chips according to IC chip design. In this case, performance testing can be performed using a specific supply voltage and a specific operating temperature and the full process distribution can be defined based on the results of the performance testing.

Figure 5:
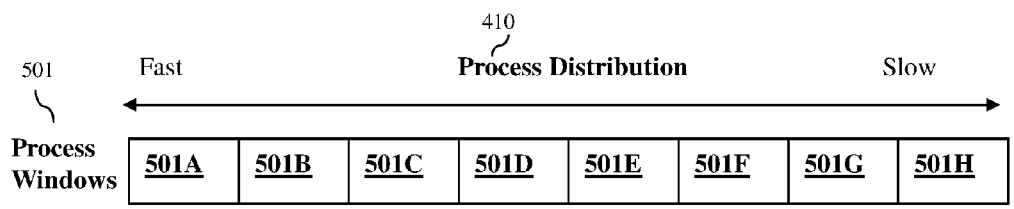
FIG. 5 illustrates the process distribution of FIG. 4 divided into different process windows.

In any case, after the process distribution 410 is defined, it can be divided into some number (M) of process windows (i.e., into some number (M) of successive intervals) from the fast end of the process distribution 410 to the slow end of the process distribution 410 (102, 202 or 302). For illustration purposes, FIG. 5 shows the process distribution 410 divided into eight different process windows 501 from process window 501A at the fast end of the process distribution 410 to process window 501H at the slow end of the process distribution 410. FIG. 5 also shows that the process windows 501 are essentially uniform. That is, in FIG. 5, the process windows 501A-H each encompasses the same number of units of sigma. However, it should be understood that the use of eight uniform process windows is for illustration purposes only and that the number of process windows and/or the number of units sigma per process window may vary from process window to process window. In any case, each process window 501A-H can be associated with a corresponding performance range (e.g., a minimum delay to a maximum delay) and each process window 501A-H can also be associated with a corresponding supply voltage range and, particularly, a minimum supply voltage and a maximum supply voltage (103, 203, or 303). Specifically, different voltage ranges can be assigned to the different process windows 501A-H such that relatively low voltage ranges are assigned to process windows at the "fast" end of the process distribution to optimize power consumption and relatively high voltage ranges are assigned to process windows at the "slow" end of the process distribution to optimize performance.

Optionally, in addition to different performance ranges and different voltage ranges, the process windows can also be associated with different leakage power ranges. Leakage power refers to the amount of power consumed by an IC chip when it is inactive and leakage power is proportional to the value of the supply voltage (Vdd) and to the leakage current. Models for leakage power can be generated for each of the process windows 501A-H. The leakage power ranges can vary from process window to process window and, more specifically, these leakage power ranges can become tighter from the fast end of the process distribution to the slow end of the process distribution. For example, process window 501A at the fast end of the process distribution can have a leakage power range of 20 mA-80 mA, process window 501B can have a tighter leakage power range of 15 mA-65 mA, and so on. Finally, process window 501H at the slow end of the process distribution can have the tightest leakage power range of 5 mA-10 mA.

IC chips can be manufactured according to the IC chip design and, particularly, can be manufactured based on the IC design layout generated as a result of the physical design processes. These manufactured IC chips may incorporate two or more transistors with different VT-types (e.g., regular threshold voltage (RVT) transistors, high threshold voltage (HVT) transistors, mezzanine threshold voltage (MVT) transistors, super-high threshold voltage (SHVT) transistors, low threshold voltage (LVT) transistors, ultra-high threshold voltage (UHVT) transistors, etc.). Furthermore, two or more transistors with the same VT-type may have different maximum fan-outs. Those skilled in the art will recognize that the term "fan-out" refers to the number of gate inputs a given transistor can connect to and, more specifically, the term "maximum fan-out" refers to the load-driving capability of the output of a transistor (i.e., highest number of gate inputs to which the output load of the transistor can be connected to for load driving).

As mentioned above, the methods disclosed herein provide for selective voltage binning (SVB) that is sensitive to the different VT-types of transistors on the IC chip (see FIG. 1), to the different maximum fan-outs for a specific VT-type of transistor (see FIG. 2) or to both the different VT-types of transistors and the different maximum fan-outs of those transistors (see FIG. 3).

For example, referring to FIG. 1, SVB that is sensitive to the different VT-types of transistors can proceed as follows. Each manufactured IC chip can have multiple transistors with different VT-types including at least first transistors with a first VT-type and second transistors with a second VT-type that is different from the first VT-type (108). For purposes of illustration, the method is described below with respect to two different VT-type transistors; however, it should be understood that the method could, alternatively, be applied to IC chips with any number of two or more different VT-type transistors. In any case, testing of the manufactured IC chips can be performed to acquire performance measurements from performance monitors associated with each of the different VT-type transistors (110). Specifically, testing of the manufactured IC chips can be performed to acquire first performance measurements from first performance monitors associated with the first transistors having the first VT-type and to acquire second performance measurements from second performance monitors associated with the second transistors having the second VT-type. That is, each IC chip can be tested to acquire a first performance measurement from a first performance monitor electrically connected to a first transistor, which is on the IC chip and which has the first VT-type, and to also acquire a second performance measurement from a second performance monitor electrically connected to a second transistor, which is also on the IC chip and which has the second VT-type. This testing process 110 should be performed using a predetermined supply voltage and a predetermined operating temperature and, more particularly, a predetermined supply voltage and a predetermined operating voltage that are either the same as, or correlated to, the specific supply voltage and the specific operating temperature that were used when defining the full process distribution as discussed above. Optionally, at process 110, leakage power measurements can also be acquired.

Various different on-chip and in-Kerf performance monitor structures are known in the art. One exemplary performance monitor that can be used in conjunction with this method is a performance screen ring oscillator (PSRO). Those skilled in the art will recognize that a PSRO is an on-chip structure with a ring of free-running, series-connected devices. The speed of a transistor under test can be determined based on the oscillation frequency of the PSRO output signal (i.e., the PSRO output signal frequency). Various different PSRO structures are well known in the art and, thus, the details are omitted from this specification in order to allow the reader to focus on the salient aspects of the disclosed embodiments. Additionally, various different techniques for measuring leakage power of IC chips are well known in the art. Thus, the details of such techniques are omitted from this specification in order to allow the reader to focus on the salient aspects of the disclosed embodiments.

Figure 6:
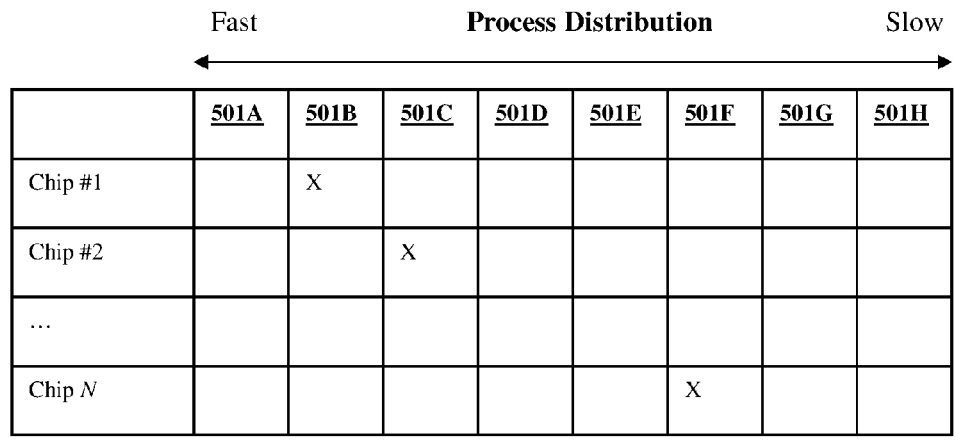
FIG. 6 is a table illustrating exemplary initial chip group assignment based on first performance measurements acquired from first performance monitors.

Based on the first performance measurements acquired during testing at process 110, the manufactured IC chips can be assigned to groups corresponding to the process windows, which were defined at process 103 (112). That is, for each IC chip, the first performance measurement acquired at process 110 can be compared to the corresponding performance ranges associated with the process windows and the IC chip can be assigned accordingly. For example, a specific IC chip can be assigned to a first group corresponding to a first process window, when a first performance measurement acquired from a first performance monitor that is on the specific IC chip and that is associated with a first transistor having the first VT-type, falls within a first performance range associated with that first process window. FIG. 6 is a table illustrating exemplary initial chip group assignment based on the first performance measurements acquired from first performance monitors. In this case, chip #1 is assigned to a group corresponding to process window 501B, chip #2 is assigned to a group corresponding to process window 501C, . . . and chip #N is assigned to a group corresponding to process window 501F.

Figure 7:
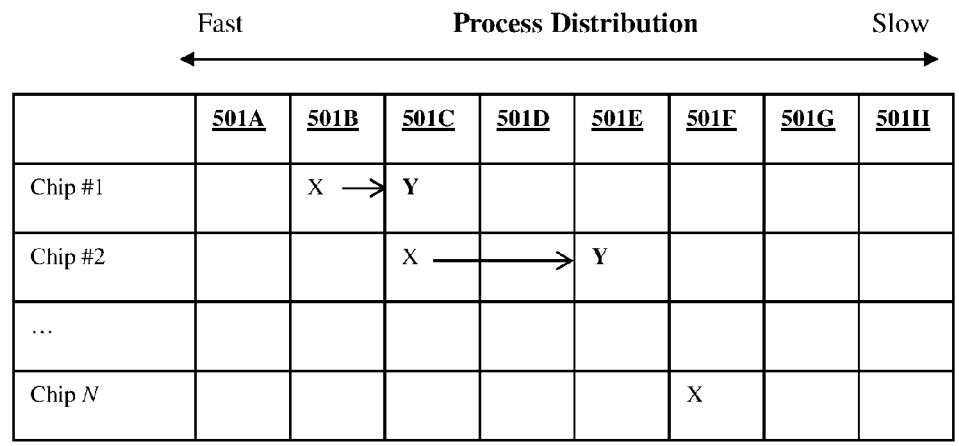
FIG. 7 is a table illustrating exemplary chip group reassignment based on second performance measurements acquired from second performance monitors.

Then, based on the second performance measurements acquired during testing at process 110, a determination can be made as to whether or not chip group reassignment is warranted (114). That is, for each IC chip, the second performance measurement acquired at process 110 can be compared to the corresponding performance ranges associated with the process windows and a determination can be made as to whether or not the IC chip should be reassigned to a different group than the group it was originally assigned to at process 112. For example, the specific IC chip that was previously assigned to the first group, as discussed above, can be selected. Then, a determination can be made as to whether a second performance measurement, which is acquired from a second performance monitor associated with a second transistor on that specific IC chip, is slower than a slowest performance measurement indicated by the first performance range. When the second performance measurement is slower than the slowest performance measurement indicated by the first performance range, the specific IC chip can be reassigned to a second group, which corresponds to a second process window associated with a second performance range into which the second performance measurement falls and a second minimum supply voltage that is higher than the first minimum supply voltage. By increasing the minimum supply voltage at which this specific IC chip will operate, the method improves the accuracy of the SVB process by ensuring that the specific IC chip will not fail during subsequent testing or when incorporated into a product and operated at a less than optimal minimum supply voltage. This process can be repeated for each IC chip to determine whether that IC chip was assigned to the optimal group. FIG. 7 is a table illustrating exemplary chip group reassignment based on the second performance measurements acquired from second performance monitors. In this case, chip #1 has been reassigned from the group corresponding to process window 501B to the group corresponding to process window 501C, chip #2 has been reassigned from the group corresponding to process window 501C to the group corresponding to the process window 501E, . . . and chip #N has not been reassigned.

The method illustrated in FIG. 1 can also include additional process steps that further provide for supply voltage sensitive and/or operating temperature sensitive SVB. For example, additional testing of the IC chips can be performed to acquire additional first performance measurements from the first performance monitors, which are associated with the first transistors having the first VT-type, and to also acquire additional second performance measurements from the second performance monitors, which are associated with the second transistors having the second VT-type (116). The additional testing at process 116 can be performed in the same manner as described above at process 110, except that the additional testing can be performed using a different supply voltage than the specific supply voltage used at process 110 and/or a different operating temperature than the specific operating temperature used at process 110. For example, the specific supply voltage used for testing at process 110 can be the target supply voltage for the technology node at issue (e.g., 900 mv). The additional testing performed at process 116 can be a lower supply voltage (e.g., 850 mv). This minimum supply voltage can, for example, be a minimum supply voltage specified by a customer. Based on the additional first performance measurements and/or the additional second performance measurements acquired at process 116, a determination can be made as to whether or not additional chip group reassignment is warranted (118). For example, the specific IC chip that was previously assigned to the first group and then subsequently reassigned to the second group, as discussed above, can be selected. Then, a determination can be made as to whether an additional first performance measurement or an additional second performance measurement acquired from testing that specific IC chip is slower than a slowest performance measurement indicated by the second performance range. If so, the specific IC chip can be reassigned to a third group, which corresponds to a third process window associated with a third performance range into which the additional first performance measurement or additional second performance measurement falls and a third minimum supply voltage that is higher than the second minimum supply voltage. These processes 116-118 can be iteratively repeated using multiple different supply voltages (e.g., 800 mv, 750 mv, etc.) and/or multiple different operating temperatures to further improve SVB accuracy.

Referring to FIG. 2, SVB that is sensitive to different maximum fan-outs associated with transistors having the same VT-type can proceed as follows. Each manufactured IC chip can have multiple transistors with the same VT-type, but different maximum fan-outs including at least first transistors with a specific VT-type and a first maximum fan-out and second transistors with the same specific VT-type, a second maximum fan-out that is different from the first maximum fan-out (208). For purposes of illustration, the method is described below with respect to a specific VT-type transistor associated with two different maximum fan-out values; however, it should be understood that the method could, alternatively, be applied to IC chips where two or more different maximum fan-out values are associated with transistors having the same VT-type. In any case, testing of the manufactured IC chips can be performed to acquire performance measurements from these transistors having the same VT-type, but different maximum fan-outs (210). Specifically, testing of the manufactured IC chips can be performed to acquire first performance measurements from first performance monitors associated with the first transistors having the specific VT-type and the first maximum fan-out and to acquire second performance measurements from second performance monitors associated with the second transistors having the same specific VT-type and the second maximum fan-out. That is, each IC chip can be tested to acquire a first performance measurement from a first performance monitor electrically connected to a first transistor, which is on the IC chip and which has the specific VT-type and the first maximum fan-out, and to also acquire a second performance measurement from a second performance monitor electrically connected to a second transistor, which is also on the IC chip and which has the same specific VT-type and the second maximum fan-out. This testing process 210 should be performed using a predetermined supply voltage and a predetermined operating temperature and, more particularly, a predetermined supply voltage and a predetermined operating temperature that are either the same as or correlated to the specific supply voltage and the specific operating temperature that were used when defining the full process distribution as discussed above. Optionally, at process 210, leakage power measurements can also be acquired.

As mentioned above with regard to the method of FIG. 1, various different on-chip and in-Kerf performance monitor structures are known in the art. One exemplary performance monitor that can be used in conjunction with this method is a performance screen ring oscillator (PSRO). Those skilled in the art will recognize that a PSRO is an on-chip structure with a ring of free-running, series-connected devices. The speed of a transistor under test can be determined based on the oscillation frequency of the PSRO output signal (i.e., the PSRO output signal frequency). Various different PSRO structures are well known in the art and, thus, the details are omitted from this specification in order to allow the reader to focus on the salient aspects of the disclosed embodiments. Additionally, various different techniques for measuring leakage power of IC chips are well known in the art. Thus, the details of such techniques are omitted from this specification in order to allow the reader to focus on the salient aspects of the disclosed embodiments.

Based on the first performance measurements acquired during testing at process 210, the manufactured IC chips can be assigned to groups corresponding to the process windows, which were defined at process 203 (212). It should be understood that process 212 can be performed in essentially the same manner as described above with regard to process 112 of FIG. 1. That is, for each IC chip, the first performance measurement acquired at process 210 can be compared to the corresponding performance ranges associated with the process windows and the IC chip can be assigned accordingly.

Then, based on the second performance measurements acquired during testing at process 210, a determination can be made as to whether or not chip group reassignment is warranted (214). It should be understood that process 214 can be performed in essentially the same manner as described above with regard to process 114 of FIG. 1. That is, for each IC chip, the second performance measurement acquired at process 210 can be compared to the corresponding performance ranges associated with the process windows and a determination can be made as to whether or not the IC chip should be reassigned to a different group than the group it was originally assigned to at process 212.

The method illustrated in FIG. 2 can also include additional process steps that further provide for supply voltage sensitive and/or operating temperature sensitive SVB. For example, additional testing of the IC chips can be performed to acquire additional first performance measurements from the first performance monitors, which are associated with the first transistors having the specific VT-type and the first maximum fan-out, and to also acquire additional second performance measurements from the second performance monitors, which are associated with the second transistors having the same specific VT-type and the second maximum fan-out (216). The additional testing at process 216 can be performed in the same manner as described above at process 210, except that the additional testing can be performed using a different supply voltage than the specific supply voltage used at process 210 and/or a different operating temperature than the specific operating temperature used at process 210. For example, the specific supply voltage used for testing at process 210 can be the target supply voltage for the technology node at issue (e.g., 900 mv). The addition testing at process 216 can be performed at a lower supply voltage (e.g., 850 mv). This minimum supply voltage can, for example, be a minimum supply voltage specified by a customer. Based on the additional first performance measurements and/or the additional second performance measurements acquired at process 216, a determination can be made as to whether or not additional chip group reassignment is warranted (218). It should be understood that processes 216-218 can be performed in essentially the same manner as described above with regard to processes 116-118 of FIG. 1. In any case, these processes 216-218 can be iteratively repeated using multiple different supply voltages (e.g., 800 mv, 750 mv, etc.) and/or multiple different operating temperatures to further improve SVB accuracy.

Referring to FIG. 3, SVB that is sensitive to both different VT-type transistors and different maximum fan-outs associated with those transistors can proceed as follows. Each manufactured IC chip can have multiple transistors with the different VT-types and different maximum fan-outs including at least first transistors with a first VT-type and a first maximum fan-out, second transistors with the first VT-type and a second maximum fan-out that is different from the first maximum fan-out, third transistors with a second VT-type that is different from the first VT-type and a third maximum fan-out, and fourth transistors with the second VT-type and a fourth maximum fan-out that is different from the third maximum fan-out (308). For purposes of illustration, the method is described below with respect to two different VT-type transistors, each associated with two different maximum fan-out values; however, it should be understood that the method could, alternatively, be applied to IC chips with where two or more different VT-type transistors, each with two or more different maximum fan-out values. In any case, testing of the manufactured IC chips can be performed to acquire performance measurements from theses transistors (310). Specifically, testing of the manufactured IC chips can be performed to acquire first performance measurements from first performance monitors associated with the first transistors (which have the first VT-type and the first maximum fan-out), to acquire second performance measurements from second performance monitors associated with the second transistors (which have the first VT-type and the second maximum fan-out), to acquire third performance measurements from third performance monitors associated with the third transistors (which have the second VT-type and the third maximum fan-out) and to acquire fourth performance measurements from fourth performance monitors associated with the fourth transistors (which have the second VT-type and the fourth maximum fan-out). This testing process 310 should be performed using a predetermined supply voltage and a predetermined operating temperature and, more particularly, a predetermined supply voltage and a predetermined operating temperature that are either the same as or correlated to the specific supply voltage and the specific operating temperature that were used when defining the full process distribution as discussed above. Optionally, at process 310, leakage power measurements can also be acquired.

As mentioned above with regard to the method of FIG. 1, various different on-chip and in-Kerf performance monitor structures are known in the art. One exemplary performance monitor that can be used in conjunction with this method is a performance screen ring oscillator (PSRO). Those skilled in the art will recognize that a PSRO is an on-chip structure with a ring of free-running, series-connected devices. The speed of a transistor under test can be determined based on the oscillation frequency of the PSRO output signal (i.e., the PSRO output signal frequency). Various different PSRO structures are well known in the art and, thus, the details are omitted from this specification in order to allow the reader to focus on the salient aspects of the disclosed embodiments. Additionally, various different techniques for measuring leakage power of IC chips are well known in the art. Thus, the details of such techniques are omitted from this specification in order to allow the reader to focus on the salient aspects of the disclosed embodiments.

Based on the first performance measurements acquired during testing at process 310, the manufactured IC chips can be assigned to groups corresponding to the process windows, which were defined at process 303 (312). It should be understood that process 312 can be performed in essentially the same manner as described above with regard to processes 112 of FIG. 1 and 212 of FIG. 2. That is, for each IC chip, the first performance measurement acquired at process 310 can be compared to the corresponding performance ranges associated with the process windows and the IC chip can be assigned accordingly.

Then, based on the second performance measurements, third performance measurements and fourth performance measurements acquired during testing at process 310, a determination can be made as to whether or not chip group reassignment is warranted (314). That is, for each IC chip, the second performance measurement, third performance measurement and fourth performance measurement acquired at process 310 can be compared to the corresponding performance ranges associated with the process windows and a determination can be made as to whether or not the IC chip should be reassigned to a different group than the group it was originally assigned to at process 312. For example, a specific IC chip that was previously assigned to a first group, which corresponds to a first process window associated with a first performance range and a first minimum supply voltage, can be selected. Then, a determination can be made as to whether a second performance measurement (which is acquired from a second performance monitor associated with a second transistor on the specific IC chip), a third performance measurement (which is acquired from a third performance monitor associated with a third transistor on the IC chip), and/or a fourth performance measurement (which is acquired from a fourth performance monitor associated with a fourth transistor on the IC chip) is slower than a slowest performance measurement indicated by the first performance range. When the second, third and/or the fourth performance measurement is/are slower than the slowest performance measurement indicated by the first performance range, the specific IC chip can be reassigned to a second group, which corresponds to a second process window associated with a second performance range and a second minimum supply voltage that is higher than the first minimum supply voltage.

Like the methods illustrated in FIGS. 1 and 2 above, the method illustrated in FIG. 3 can also include additional process steps that further provide for supply voltage sensitive and/or operating temperature sensitive SVB. For example, additional testing of the IC chips can be performed to acquire additional first performance measurements from the first performance monitors, to acquire additional second performance measurements from the second performance monitors, to acquire additional third performance measurements from the third performance monitors and to acquire additional fourth performance measurements from the fourth performance monitors (316). The additional testing at process 316 can be performed in the same manner as described above at process 310, except that the additional testing can be performed using a different supply voltage than the specific supply voltage used at process 310 and/or a different operating temperature than the specific operating temperature used at process 310. For example, the specific supply voltage used for testing at process 310 can be the target supply voltage for the technology node at issue (e.g., 900 mv). The addition testing at process 316 can be performed at a lower supply voltage (e.g., 850 mv). This minimum supply voltage can, for example, be a minimum supply voltage specified by a customer. Based on the additional first performance measurements, the additional second performance measurements, the additional third performance measurements and/or the additional fourth performance measurements acquired at process 316, a determination can be made as to whether or not additional chip group reassignment is warranted (318). It should be understood that processes 316-318 can be performed in essentially the same manner as described above with regard to processes 116-118 of FIG. 1 and processes 216-218 of FIG. 2. In any case, these processes 316-318 can be iteratively repeated using multiple different supply voltages (e.g., 800 mv, 750 mv, etc.) and/or multiple different operating temperatures to further improve SVB accuracy.

It should be noted that if, in any of the methods described above and illustrated in FIGS. 1, 2 and 3 respectively, corresponding leakage power ranges are established for the process windows at process 103, 203 or 303 and leakage power measurements are acquired at process 110, 210 or 310, the leakage power measurements can optionally be considered in addition to performance measurements when determining whether chip group reassignment is warranted 114, 214 or 314 and 118, 218 or 318. Specifically, even if a performance measurement warrants reassignment of a chip from one group to another group, that chip should only be reassigned if its leakage power measurement falls within the leakage power range for the other group. For example, in the table of FIG. 7 discussed above, group reassignment was illustrated based on the second performance measurements acquired from second performance monitors. That is, chip #1 was reassigned from the group corresponding to process window 501B to the group corresponding to process window 501C, based on a second performance measurement acquired from a second performance monitor on chip #1 and chip #2 was reassigned from the group corresponding to process window 501C to the group corresponding to the process window 501E, based on a second performance measurement acquired from a second performance monitor on chip #2. FIG. 8 is a table illustrating group reassignment based on both the second performance measurements acquired from second performance monitors on each of the chips, as discussed above with regard to FIG. 7, and also on leakage measurements acquired from each of the chips. In this case, if the second performance measurement acquired from the second performance monitor on chip #1 indicates that chip #1 could be reassigned from the group associated with the process window 501B to the group associated with the process window 501C, but the leakage power measurement for chip #1 is above the leakage power range for process window 501C, then reassignment of chip #1 to the group associated with process window 501C is not warranted. Also in this case, if the second performance measurement acquired from the second performance monitor on chip #2 would warrant reassigning chip #2 from the group associated with the process window 501C to the group associated with the process window 501E, but a leakage power measurement for chip #2 is above the leakage power range for process window 501E and within the leakage power range for process window 501D, then reassignment of chip #2 to the group associated with the process window 501D is warranted instead of reassignment to the group associated with the process window 501E. This technique of performing chip reassignment based on a combination of performance and leakage power measurements minimizes yield loss when, at a later test such as module test, chips assigned to groups associated with the slow end of the process distribution are deemed too slow to operate under system use conditions and, thus, are discarded.

Referring to FIGS. 1-3, following completion of chip group reassignment as described above and prior to shipping out manufactured IC chips for incorporation into products, each of the methods further include a process step wherein, for each specific IC chip, the supply voltage range associated with the group (and process window) to which that specific IC chip was finally assigned is noted and accessible to product assembly facilities. For example, this supply voltage range can hard programmed onto the specific IC chip (e.g., programmed into programmable elements, such as fuses or anti-fuses, on the specific IC chip) so that it is readable at product assembly facilities (120, 220, or 320).

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

As described above, the present invention is a method. However, it should be understood that portions of this method (e.g., development of an initial IC design, performance of physical design processes, definition of a full process distribution for the IC design, division of the process distribution into process windows, etc.) may be implemented using a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein is an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 9:
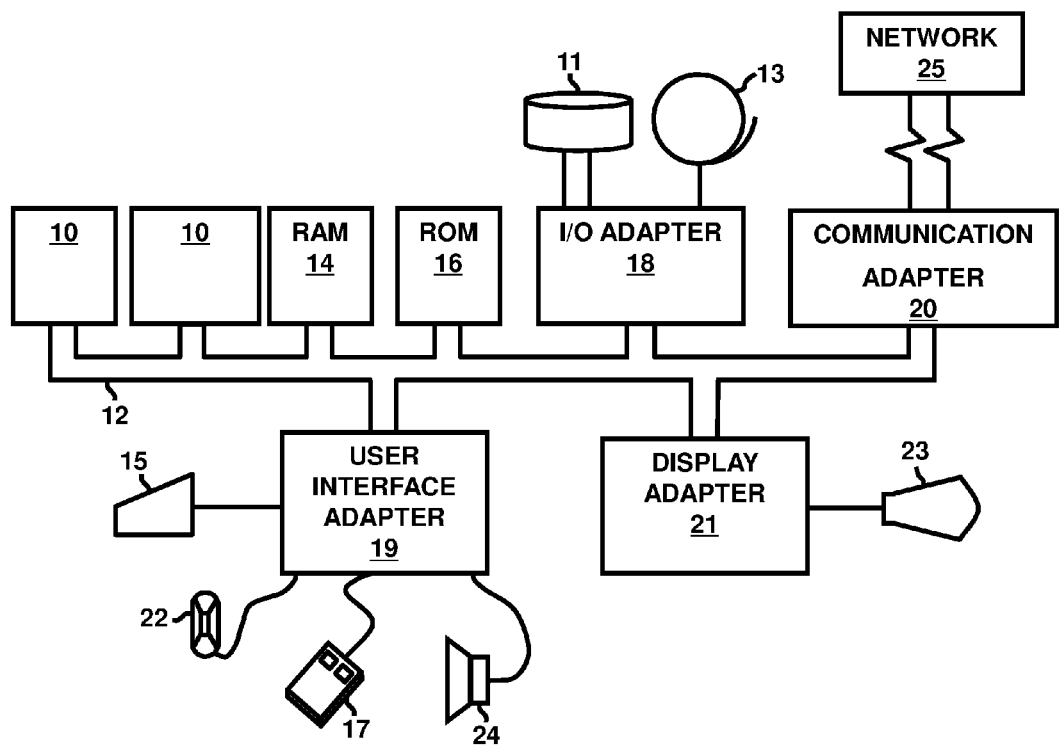
FIG. 9 is a schematic diagram illustrating a representative hardware environment for implementing the methods disclosed herein.

A representative hardware environment (i.e., a computer system) for implementing one or more of the processes of the method and/or a computer program product associated with these processes is depicted in FIG. 9. This schematic drawing illustrates a hardware configuration of an information handling/computer system in accordance with the embodiments herein. The system incorporates at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed embodiments and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are methods for performing threshold voltage-type transistor sensitive and/or fan-out sensitive selective voltage binning (SVB) to improve SVB accuracy. In the methods, a process distribution for an integrated circuit chip design can be divided into process windows, each process window being associated with a corresponding performance range and a corresponding minimum supply voltage. First performance measurements can be acquired from first performance monitors associated with first transistors on chips manufactured according to the design. Based on the first performance measurements, the chips can be assigned to groups corresponding to the process windows. Second performance measurements can also be acquired from second performance monitors associated with second transistors, which are on the chips and which have either a different threshold voltage (VT)-type or a different maximum fan-out than the first transistors. Based on the second performance measurements, a determination can be made as to whether chip group reassignment is warranted. For example, for a specific chip assigned to a specific group corresponding to a specific process window that is associated with a specific performance range, chip group reassignment would be warranted when the second performance measurement is slower than the slowest performance measurement allowed by the specific performance range. By improving the accuracy of SVB in this manner, the methods can be used to improve IC chip yield and ultimately product reliability.

What is claimed is:

1. A method comprising:
    dividing a process distribution for an integrated circuit chip design into process windows, each process window being associated with a corresponding performance range and a corresponding minimum supply voltage;
    manufacturing chips according to the design, each chip comprising at least first transistors having a first threshold voltage type and second transistors having a second threshold voltage-type;
    testing the chips to acquire first performance measurements from first performance monitors associated with the first transistors and second performance measurements from second performance monitors associated with the second transistors;
    based on the first performance measurements, assigning the chips to groups corresponding to the process windows; and,
    based on the second performance measurements, determining whether chip group reassignment is warranted.

2. The method of claim 1, the determining of whether chip group reassignment is warranted comprising:
    selecting a specific chip assigned to a first group, which corresponds to a first process window associated with a first performance range and a first minimum supply voltage;
    determining whether a second performance measurement, which is acquired from a second performance monitor associated with a second transistor on the specific chip, is slower than a slowest performance measurement indicated by the first performance range; and,
    reassigning the specific chip to a second group, which corresponds to a second process window associated with a second performance range and a second minimum supply voltage that is higher than the first minimum supply voltage, when the second performance measurement is slower than the slowest performance measurement indicated by the first performance range.

3. The method of claim 1, further comprising defining the process distribution using a specific supply voltage and at a specific operating temperature.

4. The method of claim 3, the testing being performed using the specific supply voltage and at the specific operating temperature.

5. The method of claim 4,
    performing additional testing of the chips to acquire additional first performance measurements from the first performance monitors and additional second performance measurements from the second performance monitors, the additional testing being performed using a different supply voltage than the specific supply voltage; and,
    based on the additional first performance measurements and the additional second performance measurements, determining whether additional chip group reassignment is warranted.

6. The method of claim 4, further comprising:
    performing additional testing of the chips to acquire additional first performance measurements from the first performance monitors and additional second performance measurements from the second performance monitors, the additional testing being performed at a different operating temperature than the specific operating temperature; and,
    based on the additional first performance measurements and the additional second performance measurements, determining whether additional chip group reassignment is warranted.

7. The method of claim 1, the determining of whether chip group reassignment is warranted further being based on leakage power measurements, given leakage power ranges associated with the process windows.

8. A method comprising:
    dividing a process distribution for an integrated circuit chip design into process windows, each process window being associated with a corresponding performance range and a corresponding minimum supply voltage;

manufacturing chips according to the design, each chip comprising at least first transistors having a specific threshold voltage type and a first maximum fan-out and second transistors having the specific threshold voltage-type and a second maximum fan-out;

testing the chips to acquire first performance measurements from first performance monitors associated with the first transistors and second performance measurements from second performance monitors associated with the second transistors;

based on the first performance measurements, assigning the chips to groups corresponding to the process windows; and, based on the second performance measurements, determining whether chip group reassignment is warranted.

9. The method of claim 8, the determining of whether chip group reassignment is warranted comprising:

selecting a specific chip assigned to a first group, which corresponds to a first process window associated with a first performance range and a first minimum supply voltage;

determining whether a second performance measurement, which is acquired from a second performance monitor associated with a second transistor on the specific chip, is slower than a slowest performance measurement indicated by the first performance range; and, reassigning the specific chip to a second group, which corresponds to a second process window associated with a second performance range and a second minimum supply voltage that is higher than the first minimum supply voltage, when the second performance measurement is slower than the slowest performance measurement indicated by the first performance range.

10. The method of claim 8, further comprising defining the process distribution using a specific supply voltage and at a specific operating temperature.

11. The method of claim 10, the testing being performed using the specific supply voltage and at the specific operating temperature.

12. The method of claim 11, further comprising:

performing additional testing of the chips to acquire additional first performance measurements from the first performance monitors and additional second performance measurements from the second performance monitors, the additional testing being performed using a different supply voltage than the specific supply voltage; and, based on the additional first performance measurements and the additional second performance measurements, determining whether additional chip group reassignment is warranted.

13. The method of claim 11, further comprising:

performing additional testing of the chips to acquire additional first performance measurements from the first performance monitors and additional second performance measurements from the second performance monitors, the additional testing being performed at a different operating temperature than the specific operating temperature; and, based on the additional first performance measurements and the additional second performance measurements, determining whether additional chip group reassignment is warranted.

14. The method of claim 8, the determining of whether chip group reassignment is warranted further being based on leakage power measurements, given leakage power ranges associated with the process windows.

15. A method comprising:

dividing a process distribution for an integrated circuit chip design into process windows, each process window being associated with a corresponding performance range and a corresponding minimum supply voltage;

manufacturing chips according to the design, each chip comprising at least first transistors having a first threshold voltage type and a first maximum fan-out, second transistors having the first threshold voltage type and a second maximum fan-out, third transistors having a second threshold voltage type and a third maximum fan-out and fourth transistors having the second threshold voltage type and a fourth maximum fan-out;

testing the chips to acquire first performance measurements from first performance monitors associated with the first transistors, second performance measurements from second performance monitors associated with the second transistors, third performance measurements from third performance monitors associated with the third transistors, and fourth performance measurements from fourth performance monitors associated with the fourth transistors;

based on the first performance measurements, assigning the chips to groups corresponding to the process windows; and based on any of the second performance measurements, the third performance measurements and the fourth performance measurements, determining whether chip group reassignment is warranted.

16. The method of claim 15, the determining of whether chip group reassignment is warranted comprising:

selecting a specific chip assigned to a first group, which corresponds to a first process window associated with a first performance range and a first minimum supply voltage;

determining whether, for the specific chip, any of a second performance measurement, a third performance measurement or a fourth performance measurement, is slower than a slowest performance measurement indicated by the first performance range; and, reassigning the specific chip to a second group, which corresponds to a second process window associated with a second performance range and a second minimum supply voltage that is higher than the first minimum supply voltage, when the second performance measurement, the third performance measurement or the fourth performance measurement is slower than the slowest performance measurement indicated by the first performance range.

17. The method of claim 15, further comprising defining the process distribution using a specific supply voltage and at a specific operating temperature.

18. The method of claim 17, the testing being performed using the specific supply voltage and at the specific operating temperature.

19. The method of claim 18, further comprising:

performing additional testing of the chips to acquire additional first performance measurements from the first performance monitors, additional second performance measurements from the second performance monitors, additional third performance measurements from the third performance monitors and additional fourth performance measurements from the fourth performance monitors, the additional testing being performed using a different supply voltage than the specific supply voltage; and, based on the additional first performance measurements, the additional second performance measurements, the additional third performance measurements and the additional fourth performance measurements, determining whether additional chip group reassignment is warranted.

20. The method of claim 18, further comprising:

performing additional testing to acquire additional first performance measurements from the first performance monitors, additional second performance measurements from the second performance monitors, additional third performance measurements from the third performance monitors and additional fourth performance measurements from the fourth performance monitors, the additional first performance measurements, the additional testing being performed at a different operating temperature than the specific operating temperature; and, based on the additional first performance measurements, the additional second performance measurements, the additional third performance measurements and the additional fourth performance measurements, determining whether additional chip group reassignment is warranted.

* * * * *